United States Patent
Kang et al.

(10) Patent No.: US 11,271,199 B2
(45) Date of Patent: Mar. 8, 2022

(54) METHOD FOR PATTERNING LITHIUM METAL SURFACE AND ELECTRODE FOR LITHIUM SECONDARY BATTERY USING THE SAME

(71) Applicant: LG CHEM, LTD., Seoul (KR)

(72) Inventors: Yoon-Ah Kang, Daejeon (KR); Eun-Kyung Kim, Daejeon (KR); Sang-Wook Woo, Daejeon (KR); Oh-Byong Chae, Daejeon (KR); Soo-Hee Kang, Daejeon (KR); Geun-Sik Jo, Daejeon (KR); So-Young Choo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 88 days.

(21) Appl. No.: 16/604,319

(22) PCT Filed: Aug. 17, 2018

(86) PCT No.: PCT/KR2018/009474
§ 371 (c)(1),
(2) Date: Oct. 10, 2019

(87) PCT Pub. No.: WO2019/035692
PCT Pub. Date: Feb. 21, 2019

(65) Prior Publication Data
US 2020/0052293 A1  Feb. 13, 2020

(30) Foreign Application Priority Data

Aug. 17, 2017  (KR) .......... 10-2017-0104306
Aug. 17, 2017  (KR) .......... 10-2017-0104307

(51) Int. Cl.
*H01M 4/38* (2006.01)
*H01M 4/04* (2006.01)
(Continued)

(52) U.S. Cl.
CPC .......... *H01M 4/382* (2013.01); *G03F 7/0002* (2013.01); *G03F 7/2012* (2013.01); *H01M 4/043* (2013.01);
(Continued)

(58) Field of Classification Search
None
See application file for complete search history.

(56) References Cited

U.S. PATENT DOCUMENTS 5,494,762 A    2/1996  Isoyama et al.
2008/0248386 A1  10/2008  Obrovac et al.
(Continued)

FOREIGN PATENT DOCUMENTS

CN    1841667 A    10/2006
CN    106784611 A   5/2017
(Continued)

OTHER PUBLICATIONS

Ebadi et al., "Assessing structure and stability of polymer/lithium-metal interfaces from first-principles calculations," Journal of Materials Chemistry A, vol. 7, No. 14, 2019, pp. 8394-8404.
(Continued)

*Primary Examiner* — Jeremiah R Smith
(74) *Attorney, Agent, or Firm* — Birch, Stewart, Kolasch & Birch, LLP

(57) ABSTRACT

A method for patterning a lithium metal surface, including the steps of (S1) forming an intaglio or relief pattern having a predetermined size on a patterning substrate; (S2) either (a) compressing lithium metal physically to a surface of the patterning substrate having the pattern formed thereon to form the predetermined pattern on the surface of the lithium metal, or (b) applying liquid lithium to the surface of the patterning substrate having the pattern formed thereon and solidifying the liquid lithium to form the predetermined
(Continued)

pattern on the surface of the lithium metal; and (S3) separating the lithium metal having the predetermined pattern formed thereon from the patterning substrate, wherein the patterning substrate is at least one selected from a silicon wafer or polycarbonate substrate.

3 Claims, 4 Drawing Sheets

(51) Int. Cl.
*H01M 4/1395* (2010.01)
*H01M 10/0525* (2010.01)
*G03F 7/20* (2006.01)
*G03F 7/00* (2006.01)
*H01M 4/02* (2006.01)

(52) U.S. Cl.
CPC ..... *H01M 4/1395* (2013.01); *H01M 10/0525* (2013.01); *H01M 2004/025* (2013.01)

(56) References Cited

U.S. PATENT DOCUMENTS

| | | |
|---|---|---|
| 2012/0121983 A1 | 5/2012 | Yoon et al. |
| 2013/0295453 A1 | 11/2013 | Ishikawa et al. |
| 2014/0295264 A1* | 10/2014 | Asai ................. G03F 7/0397 429/211 |
| 2015/0064909 A1* | 3/2015 | Yamashita ........... B29C 33/424 438/694 |
| 2015/0114065 A1 | 4/2015 | Kagawa et al. |
| 2017/0214054 A1 | 7/2017 | Cui et al. |
| 2019/0181421 A1 | 6/2019 | Chae et al. |

FOREIGN PATENT DOCUMENTS

| | | |
|---|---|---|
| JP | 7-272726 A | 10/1995 |
| JP | 3259850 B2 | 2/2002 |
| JP | 2005-108521 A | 4/2005 |
| JP | 2009-178734 A | 8/2009 |
| JP | 2015-63730 A | 4/2015 |
| JP | 2015-85423 A | 5/2015 |
| KR | 10-1156225 B1 | 6/2012 |
| KR | 10-2013-0111992 A | 10/2013 |
| KR | 10-2014-0069781 A | 6/2014 |
| KR | 10-2014-0108944 A | 9/2014 |
| KR | 10-2016-0053886 A | 5/2016 |
| WO | WO 2018/128321 A1 | 7/2018 |

OTHER PUBLICATIONS

Extended European Search Report dated Jun. 30, 2020 for corresponding European Patent Application No. 18846398.8.

International Search Report for PCT/KR2018/009474 dated Feb. 25, 2019.

Park et al., "Micro-Patterned Lithium Metal Anodes with Suppressed Dendrite Formation for Post Lithium-Ion Batteries", Advanced Materials Interfaces, 2016, vol. 3, No. 11, Article No. 1600140, pp. 1-9.

Ryou et al., "Mechanical Surface Modification of Lithium Metal; Towards Improved Li Metal Anode Performance by Directed Li Plating", Advanced Functional Materials, 2015, vol. 25, No. 6, pp. 834-841.

* cited by examiner

METHOD FOR PATTERNING LITHIUM METAL SURFACE AND ELECTRODE FOR LITHIUM SECONDARY BATTERY USING THE SAME

TECHNICAL FIELD

The present application claims priority to Korean Patent Application No. 10-2017-0104306 filed on Aug. 17, 2017 and Korean Patent Application No. 10-2017-0104307 filed on Aug. 17, 2017 in the Republic of Korea, the disclosures of which are incorporated herein by reference. The present disclosure relates to a method for patterning a lithium metal surface and an electrode for a lithium secondary battery using the same. Particularly, the present disclosure relates to a method for patterning a lithium metal surface by using a patterning substrate having high releasability from lithium metal, and an electrode for a lithium secondary battery using the same.

BACKGROUND ART

As electric, electronic, communication and computer industries have been developed rapidly, batteries having high capacity have been increasingly in demand. To meet such demand, lithium metal secondary batteries using lithium metal or a lithium alloy as a negative electrode having high energy density have been given many attentions.

A lithium metal secondary battery refers to a secondary battery using lithium metal or a lithium alloy as a negative electrode. Lithium metal has a low density of 0.54 g/cm$^3$ and a significantly low standard reduction potential of −3.045V (SHE: based on the standard hydrogen electrode), and thus has been most spotlighted as an electrode material for a high-energy density battery.

When using lithium metal as a negative electrode, lithium metal reacts with an electrolyte, impurities, such as water or an organic solvent, a lithium salt, or the like, to form a solid electrolyte interphase (SEI) layer. Such an SEI layer causes a local difference in current density to accelerate formation of resinous dendrite caused by lithium metal during charge. Then, such dendrite grows gradually during charge/discharge to cause an internal short-circuit between a positive electrode and a negative electrode. In addition, dendrite has a mechanically weak bottle neck portion to form dead lithium, which loses electrical contact with a current collector during discharge. As a result, the capacity of a battery is decreased, the cycle life of a battery is reduced, and the stability of a battery is degraded.

To prepare the high performance of a portable instrument, various attempts have been conductive to improve a negative electrode material of lithium metal to a practically acceptable level. Many attempts have been made to increase the surface area of a lithium metal negative electrode material. FIG. 1 illustrates a method for surface treatment of lithium metal using micro-needles. The surface treatment of lithium metal using micro-needles can treat a large surface area through simple rolling which can be carried out economically and effectively. Thus, it is possible to improve charge/discharge and cycle characteristics, to reduce interfacial resistance and to inhibit lithium precipitation on the surface of an electrode. However, since the micro-needles rotate a roller continuously, processing of the roller is very important. When the axis 103 of a roller is not disposed perfectly at the center of the roller as shown in FIG. 2, the roller surface actually performs elliptical rolling 101, not perfect circular rolling 102 during rolling, and thus the surface may not be treated uniformly. Such non-uniform treatment also occurs when the micro-needles processed on the roller surface are not uniform. Considering that the surface treatment using micro-needles is in a nanometer or micrometer scale, such surface non-uniformity directly results in degradation of the life and performance of a battery. In addition, since the roller is smaller than the conventional lithium metal foil, it is difficult to process lithium metal foil having a large area at once. Thus, it is required to carry out rolling many times for one foil, which may result in non-uniform surface treatment. The above-mentioned processing may not be problematic in the case of foil having a small area. However, when commercially available products are produced in a large amount, it may cause a serious problem.

DISCLOSURE

Technical Problem

The present disclosure is directed to providing a method for patterning a lithium metal surface which improves reversibility of lithium metal, allows uniform patterning of lithium metal with a large area as compared to the conventional patterning methods, and particularly uses a patterning substrate having high releasability from lithium metal, and an electrode for a lithium secondary battery using the same.

Technical Solution

To solve the above-mentioned technical problem, in one aspect of the present disclosure, there is provided a method for patterning a lithium metal surface according to the first embodiment of the present disclosure, the method including the steps of: (S1) forming an intaglio or relief pattern having a predetermined size on a patterning substrate; (S2) either (a) compressing lithium metal physically to a surface of the patterning substrate having the pattern formed thereon to form a predetermined pattern on the surface of the lithium metal, or (b) applying liquid lithium to the surface and solidifying the liquid lithium to form the predetermined pattern on the surface of the lithium metal; and (S3) separating the lithium metal having the predetermined pattern formed thereon from the patterning substrate.

According to the second embodiment of the present disclosure, there is provided the method for patterning the lithium metal surface as defined in the first embodiment, wherein the patterning substrate is at least one selected from a silicon wafer or polycarbonate substrate.

According to the third embodiment of the present disclosure, there is provided the method for patterning the lithium metal surface as defined in the first or the second embodiment, wherein the patterning substrate is a silicon wafer, and the method may further include a step of forming a photoresist coating layer on a surface of the silicon wafer having the pattern formed thereon, before carrying out step (S2). In a variant, the patterning substrate is a polycarbonate substrate, and step (S1) may be carried out by preparing a silicon wafer having a relief or intaglio pattern with a predetermined size and compressing the polycarbonate substrate physically thereto to form the polycarbonate substrate having the pattern formed thereon.

According to the fourth embodiment of the present disclosure, there is provided the method for patterning a lithium metal surface as defined in any one of the first to the third embodiments, wherein a horizontal section of the intaglio or relief pattern having the predetermined size may have a size of 10 μm to 900 μm.

According to the fifth embodiment of the present disclosure, there is provided the method for patterning a lithium metal surface as defined in any one of the first to the fourth embodiments, wherein a horizontal section of the intaglio or relief pattern having the predetermined size may have a polygonal, circular or elliptical shape.

According to the sixth embodiment of the present disclosure, there is provided the method for patterning the lithium metal surface as defined in any one of the first to the fifth embodiments, wherein the intaglio or relief pattern having a predetermined size may have a depth or height corresponding to 0.01 to 1 times of the size of the horizontal section of the intaglio or relief pattern having a predetermined size.

According to the seventh embodiment of the present disclosure, there is provided the method for patterning a lithium metal surface as defined in any one of the first to the sixth embodiments, wherein the photoresist coating layer may have a thickness of 0.7 μm to 1.5 μm.

In another aspect of the present disclosure, there is provided an electrode for a lithium secondary battery which includes patterned lithium metal obtained by the method as described above.

Advantageous Effects

According to an embodiment of the present disclosure, a predetermined pattern is formed on the surface of lithium metal by compressing lithium metal physically to a patterning substrate having a predetermined pattern, or applying liquid lithium thereto and solidifying it. Thus, it is possible to produce patterned lithium metal foil in a large amount. Since the patterning substrate has high releasability from lithium metal, it is possible to separate lithium metal with ease from the patterning substrate, after the lithium metal surface is patterned. Particularly, when the patterning substrate is a silicon wafer, a photoresist coating layer is formed on the surface of the silicon wafer to increase releasability from lithium metal. Therefore, when lithium metal is separated from the silicon wafer, it is possible to separate lithium metal with ease.

In addition, it is possible to carry out patterning with various shapes and a large area. Advantageously, it is possible to minimize a non-uniform pattern which may be generated by a difference in pressure.

Further, the patterned lithium metal has higher reversibility as compared to the conventional lithium metal. Thus, it is possible to improve the life of a battery significantly.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Figure 1:
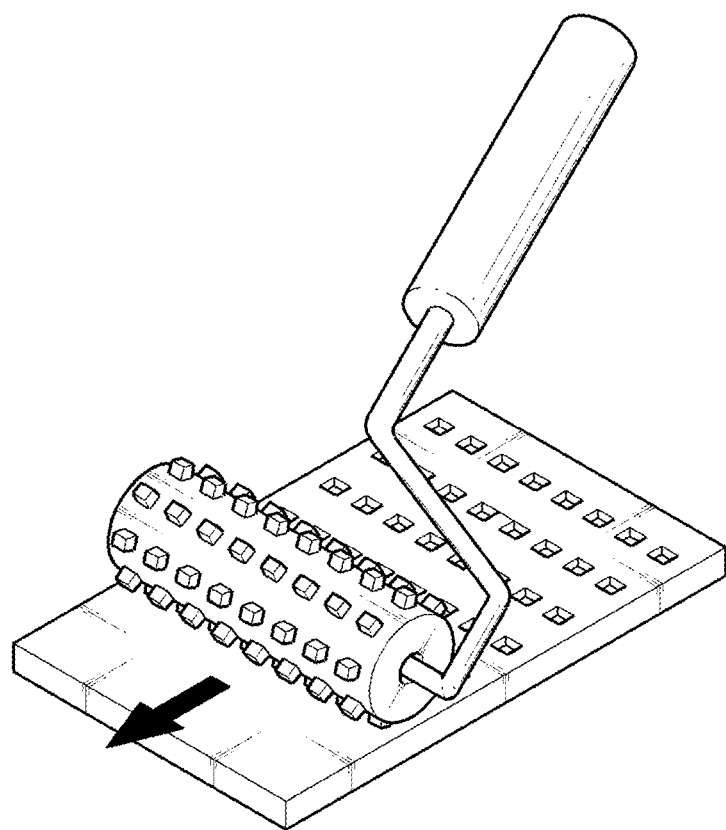
FIG. 1 is a schematic view illustrating one embodiment of the conventional method for treating a lithium metal surface by using micro-needles.
Figure 2:
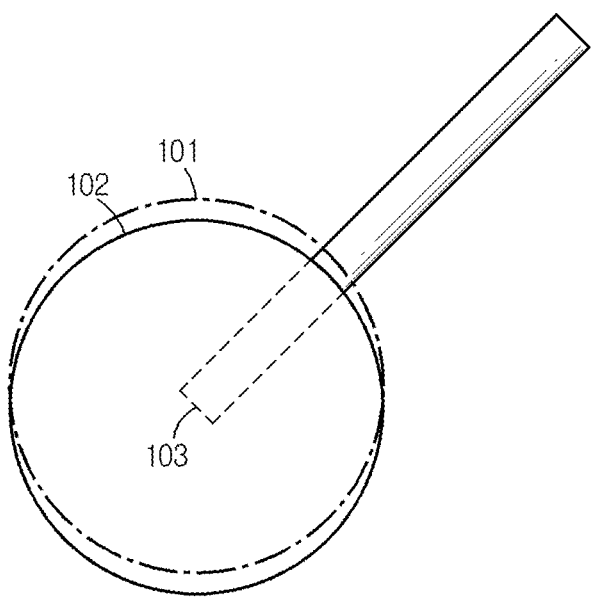
FIG. 2 is a schematic view illustrating the reason why non-uniform pressure is generated when using the conventional micro-needles.

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

The present disclosure relates a method for providing a negative electrode patterned with a predetermined pattern of intaglio and/or relief, and a negative electrode obtained thereby. The negative electrode includes lithium metal as a negative electrode active material. As described above, lithium metal has low releasability, and thus is easily attached to the surface of another material that is in contact therewith or is not separated completely from the surface of a negative electrode but protrudes out from the surface to form burrs undesirably. The present disclosure provides a method for patterning the surface of a negative electrode including lithium metal with low releasability smoothly and uniformly, and a negative electrode obtained thereby.

In one aspect of the present disclosure, there is provided a method for patterning a lithium metal surface including the steps of: (S1) forming an intaglio or relief pattern having a predetermined size on a patterning substrate; (S2) compressing lithium metal physically to the surface of the patterning substrate having the pattern formed thereon, or applying liquid lithium thereto and solidifying it to form a predetermined pattern on the surface of lithium metal; and (S3) separating the lithium metal having the predetermined pattern formed thereon from the patterning substrate.

Thus, a predetermined pattern is formed on the surface of lithium metal by compressing lithium metal physically to a patterning substrate having a predetermined pattern, or applying liquid lithium thereto and solidifying it. As a result, it is possible to produce patterned lithium metal foil in a large amount.

According to an embodiment of the present disclosure, the patterning substrate has high releasability from lithium metal. For example, the patterning substrate is at least one selected from a silicon wafer and a polycarbonate substrate.

According to the present disclosure, when the patterning substrate is a silicon wafer, it is preferred that the surface of the substrate is totally coated with a photoresist coating layer, wherein the photoresist coating layer is formed with a uniform thickness along the height difference of the pattern formed on the silicon wafer substrate. The patterning substrate including a silicon wafer whose surface is coated with a photoresist coating layer may be prepared by the following method.

First, the silicon wafer is patterned so that it may have a predetermined pattern. According to an embodiment of the present disclosure, the patterning may be carried out without any particular limitation, as long as it can be applied to a process for fabricating a semiconductor substrate and allows patterning of the surface of a silicon wafer surface. According to another embodiment of the present disclosure, a photolithography process may be used to carry out patterning. For example, the photolithography process may include the steps of: preparing a plate-type silicon wafer having no surface pattern and carrying out spin coating of a photoresist layer on the surface thereof, exposing the photoresist layer selectively by using a photomask, or the like; developing the exposed photoresist layer to generate a mask pattern; carrying out etching or doping on the region of the semiconductor substrate not shielded by the photoresist; and carrying out ashing to remove the photoresist pattern used as a mask during the etching and doping step. A predetermined pattern is formed on the surface of the silicon wafer through the above-mentioned steps.

The pattern is not limited to any specific shape or specific range of values. The pattern may depend on the design of a battery, such as the purpose of use or application of a battery, and the pattern shape, line width or depth of the intaglio or relief pattern, or the like, may be variable.

When a silicon wafer provided with a predetermined pattern on the surface thereof is obtained according to the above-described method, a photoresist coating layer is formed on the surface. The coating layer may have the same or different ingredients as compared to the photoresist layer in the above-mentioned photolithography process. According to an embodiment of the present disclosure, the photoresist coating layer may include a polymer compound which undergoes chemical reaction by the light and electron beams and is used conventionally for a photoresist layer in the field of semiconductors. Particular examples of such a polymer include norbornene/maleic anhydride copolymer, norbornene/maleate copolymer, and methacrylate polymer having a pendant alicyclic structure. The photoresist coating layer may include at least one of the above-listed polymers, but is not limited thereto. The surface of the silicon wafer is provided with releasability from lithium metal by virtue of the photoresist coating layer. It is important to form a thin and uniform layer depending on the height difference of the pattern so that the resolution of the pattern may not be decreased due to the formation of the coating layer. It is preferred for the photoresist coating layer to have a thickness sufficient for providing the surface with releasability.

Thus, since the photoresist coating layer formed on the surface of the silicon wafer increases releasability from lithium metal, it is possible to separate lithium metal easily from the silicon wafer when lithium metal is separated from the silicon wafer.

According to an embodiment of the present disclosure, the photoresist coating layer may have a thickness of 0.7-1.5 μm. When the photoresist coating layer satisfies the above-defined thickness range, it is possible to ensure releasability from lithium metal, while not significantly affecting the size of the pattern formed on the silicon wafer.

When the photoresist coating layer has a thickness less than 0.7 μm, it cannot be coated well on the patterned silicon wafer, thereby making it difficult to ensure releasability from lithium metal. In addition, when the photoresist coating layer has a thickness larger than 1.5 μm, it becomes excessively thick to cause deformation of the original shape of the pattern formed on the silicon wafer, thereby making it difficult to form a pattern on lithium metal.

Meanwhile, according to an embodiment of the present disclosure, the patterning substrate may be a polymer substrate. The polymer substrate preferably has higher strength as compared to lithium metal in order to form a pattern on the surface of lithium metal through compression, after forming a predetermined pattern on the surface thereof. In addition, the polymer substrate preferably has high releasability from lithium metal to prevent generation of burrs on the surface of lithium metal after compression, or to prevent lithium metal from being attached to the patterning substrate. For example, the polymer substrate may be a polycarbonate substrate including a polycarbonate material. Since polycarbonate has high releasability from lithium metal, lithium metal can be separated with ease when it is separated from the polycarbonate substrate. Particularly, since the polycarbonate substrate itself is flexible, it is possible to carry out patterning of lithium metal through a simple rolling process, and it is possible to remove the polycarbonate substrate efficiently from lithium metal after forming a pattern.

According to an embodiment of the present disclosure, patterning of the polycarbonate substrate may be carried out by using a mold made of a ceramic or metallic material. As described above, since polycarbonate is a flexible material having ductility, it is possible to introduce a predetermined pattern to the polycarbonate substrate by compressing the plate-type polycarbonate substrate against the mold. Otherwise, patterning of the polycarbonate substrate may be carried out by melting polycarbonate or dissolving polycarbonate into a desired solvent to form a polymer solution and casting the polymer solution to the mold.

According to an embodiment of the present disclosure, the mold used herein may be a silicon wafer having the pattern obtained by the above-described method. For example, a silicon wafer substrate obtained from the photolithography process may be used to compress the polycarbonate substrate physically so that the polycarbonate substrate may be provided with the pattern. In this case, since it is not required to consider the releasability of the silicon wafer substrate from the polycarbonate substrate, there is no need for forming a photoresist coating layer on the surface of the silicon wafer substrate.

Meanwhile, according to the present disclosure, the patterning accords with a desired negative electrode pattern and pattern width or the depth is determined by the purpose of use of a negative electrode or characteristics to be realized, and thus the patterning is not limited to any particular pattern. Herein, the horizontal section of the intaglio or relief pattern formed on the patterning pattern with a predetermined size may have a size of 10-900 μm independently. In addition, in the case of an intaglio pattern, the pattern may have a depth of 10-20 μm, but is not limited thereto. According to an embodiment, the negative electrode pattern may have a line width of 10 μm or more, or 20 μm, and an interval of 10 μm or more, or 20 μm.

The pattern formed on the patterning substrate may have various shapes and it is possible to form a pattern with a larger area as compared to the conventional roller-type micro-needles. The most fundamental pattern may be repeated squares or hexagons (honeycomb structure). In addition to this, various polygons, such as triangles, and circular or elliptical shapes, or various geometrical lattice patterns may be formed.

In addition, the depth or height of the intaglio or relief pattern with a predetermined size may correspond to 0.01-1 times of the size of the horizontal section of the intaglio or relief pattern with a predetermined size.

Meanwhile, in step (S2), lithium foil may be disposed on a patterning substrate having an intaglio or relief pattern formed thereon, and then a predetermined level of physical pressure may be applied thereto by using a roller, press, or the like. Herein, the physical pressure applied to the lithium metal foil may be varied with the thickness of lithium metal foil and the height of intaglio and relief of the patterning substrate. When the lithium metal foil is separated from the patterning substrate after removing the physical pressure, it is possible to obtain patterned lithium metal finally. In this case, when the patterning substrate is a polycarbonate substrate, polycarbonate has high releasability from lithium metal, and thus it is possible to carry out separation from lithium metal with ease. In addition, when the patterning substrate is a silicon wafer, it is possible to carry out separation from lithium metal with ease by virtue of the photoresist coating layer formed on the surface thereof.

It is possible to obtain a lithium secondary battery by using the lithium metal patterned according to the present disclosure. Herein, a positive electrode, separator and a non-aqueous electrolyte used conventionally for a lithium secondary battery may be used.

When using the patterned lithium metal as a negative electrode, it is possible to improve the charge/discharge capacity and efficiency of a battery.

The patterned lithium metal has a larger surface area as compared to non-treated lithium metal. When carrying out charge/discharge at the same current density, the patterned lithium metal provides relatively lower current density to allow stable charge/discharge.

A lithium metal secondary battery undergoes charge/discharge, while lithium is intercalated/deintercalated to/from the lithium metal surface. When such a lithium metal secondary battery is subjected to charge/discharge at high current density, lithium metal is grown non-ideally and deintercalation of the corresponding portion causes degradation of the reversibility of a cell and adversely affects the stability of a cell.

The patterned lithium metal according to the present disclosure has an increased surface area and provides relatively lower current density, thereby inhibiting non-ideal growth of lithium metal. Thus, it is possible to improve the overall performance of a battery, which becomes significant as charge/discharge cycles are repeated.

The patterned lithium metal according to the present disclosure can be obtained uniformly with a larger area as compared to the conventional patterning using microneedles. In addition, there is no problem caused by a difference in pressure during rolling. Further, it is possible to carry out patterning with a large area. Thus, the patterned lithium metal according to the present disclosure can be applied actually to a commercially available process.

Meanwhile, according to an embodiment of the present disclosure, when the patterning substrate is a silicon wafer, it is possible to separate lithium metal with ease when lithium metal is separated from the silicon wafer, since the photoresist coating layer formed on the surface thereof increases releasability from lithium metal.

MODE FOR DISCLOSURE

Examples will be described more fully hereinafter so that the present disclosure can be understood with ease. The following examples may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art.

Example 1

<Patterning of Lithium Metal>

A micropatterned silicon wafer having a width of 100 μm, a length of 100 μm and a height of 17 μm was coated with a photoresist coating layer.

Figure 3:
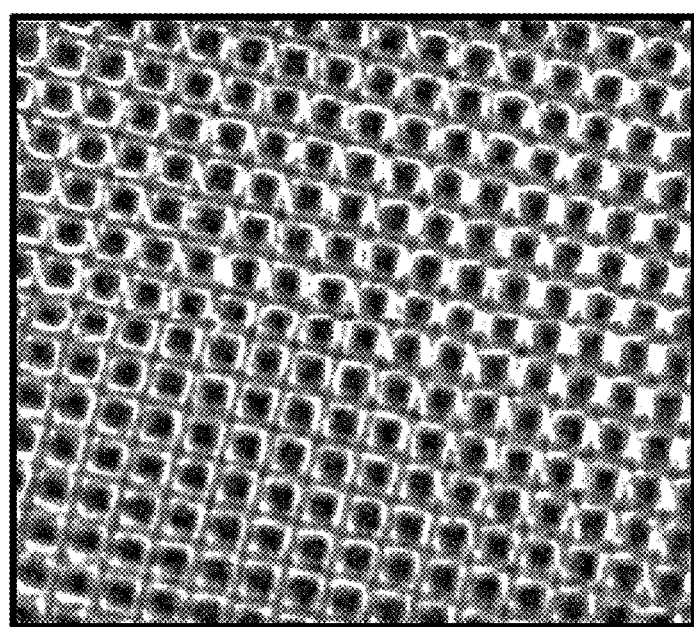
FIG. 3 is a scanning electron microscopic (SEM) image illustrating the surface of a silicon wafer having a photoresist coating layer formed thereon according to an embodiment of the present disclosure.

FIG. 3 is a scanning electron microscopic (SEM) image illustrating the surface of a silicon wafer having a photoresist coating layer formed thereon according to an embodiment of the present disclosure.

Herein, the photoresist coating layer had a thickness of 1.0 μm. Then, lithium metal was placed on the patterned silicon wafer and pressed under a predetermined pressure. The pressed lithium metal was separated from the silicon wafer. In this manner, lithium metal micropatterned to a width of 20 μm, a length of 20 μm and a height of 20 μm was obtained.

Example 2

<Fabrication of Polycarbonate Substrate>

Figure 6A:
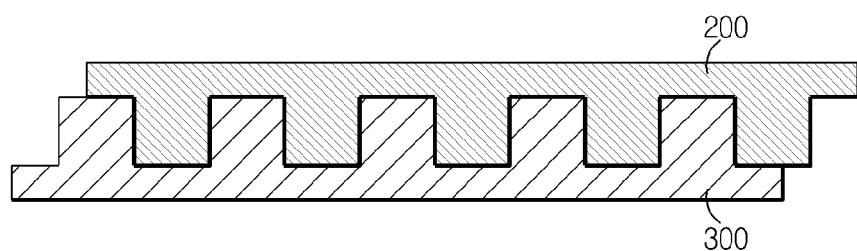
FIG. 6*a* is a schematic view illustrating formation of a pattern on a polycarbonate substrate using a silicon wafer according to an embodiment of the present disclosure.
Figure 6B:
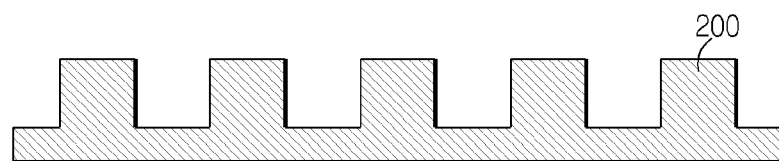
FIG. 6*b* is a schematic view illustrating the section of the polycarbonate substrate having a predetermined pattern prepared according to FIG. 6*a*.

Polycarbonate was allowed to be in close contact with the micropatterned silicon wafer having a width of 100 .mu.m, a length of 100 .mu.m and a height of 17 .mu.m, and pressure was applied thereto to obtain a polycarbonate substrate having a pattern opposite to the pattern formed on the silicon wafer. FIG. 1a is a schematic view illustrating formation of a pattern on a polycarbonate substrate (200) using a silicon wafer (300) according to an embodiment of the present disclosure, and FIG. 6b is a schematic view illustrating the section of the polycarbonate substrate 200) having a predetermined pattern prepared according to FIG. 6a.

<Patterning of Lithium Metal>

The polycarbonate substrate having the micropattern was allowed to be in contact with lithium metal, and a presser was used to form a pattern on the surface of lithium metal. Then, the polycarbonate substrate was removed. In this manner, lithium metal micropatterned to a width of 20 μm, a length of 20 μm and a height of 20 μm was obtained.

Test

1. Manufacture of Lithium Secondary Battery

First, 96 wt % of $LiCoO_2$ as a positive electrode active material, 2 wt % of Denka black (conductive material) and 2 wt % of polyvinylidene fluoride (PVdF, binder) were added to N-methyl-2-pyrrolidone (NMP) to obtain positive electrode material slurry. The obtained positive electrode material slurry was coated on one surface of an aluminum current collector, followed by drying, pressing and punching into a predetermined size. In this manner, a positive electrode was obtained.

As a counter electrode, each patterned lithium metal foil according to Examples 1 and 2 was used. A polyolefin-based separator was interposed between the positive electrode and the counter electrode, and then an electrolyte containing 1M $LiPF_6$ dissolved in a mixed solvent including ethylene carbonate (EC) and ethyl methyl carbonate (EMC) at a volume ratio of 50:50 was injected to obtain a coin-type half-cell.

<Charge/Discharge>

The obtained coin-type half-cell was charged/discharged by using an electrochemical charger/discharger. Charging was carried out to 4.4V Vs. Li/Li$^+$ and discharging was carried out to 3.0V Vs. Li/Li$^+$, and the current density was applied at 0.5 C-rate.

Comparative Example

A coin-type half-cell obtained by the same method as Example, except that lithium metal foil subjected no patterning treatment was used as a counter electrode instead of the patterned lithium metal foil, was used. The coin-type half-cell was charged/discharged under the same charge/discharge condition as Example.

Test Example 1: Observation of Lithium Metal Surface

Figure 4:
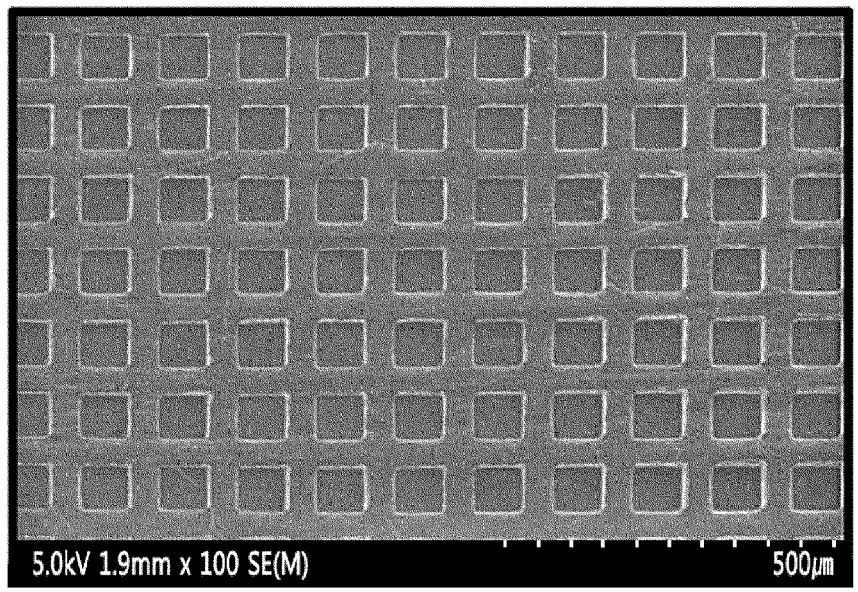
FIG. 4 is an SEM image illustrating lithium metal patterned according to an embodiment of the present disclosure.

The patterned lithium metal according to Example 1 was observed by scanning electron microscopy (SEM). The SEM image is shown in FIG. 4. The interval between one lattice and another lattice is about 100 μm, suggesting that a micropattern having a predetermined shape is formed uniformly.

Test Example 2: Comparison of Electrochemical Charge/Discharge Characteristics

The charge capacity and discharge capacity were measured during the charge/discharge in each of Examples 1 and 2 and Comparative Example. The results are shown in FIG. 5.

Figure 5:
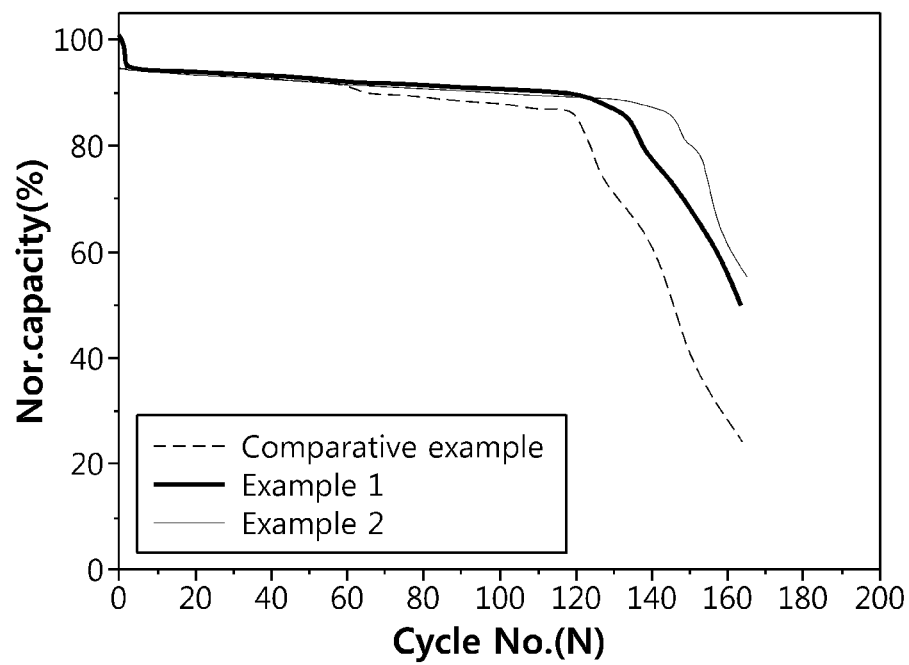
FIG. 5 is a graph illustrating the charge capacity and discharge capacity determined during charge/discharge in one embodiment of the present disclosure and in a comparative example.

As shown in FIG. 5, Examples and Comparative Example show similar cycle characteristics at the initial stage of cycles. However, after the 100th cycle, a difference in cycle characteristics can be seen. Examples 1 and 2 show excellent cycle characteristics as compared to Comparative Example, and such a difference in cycle characteristics is increased, as cycles are repeated.

Therefore, it can be seen from the above results that use of the patterned lithium metal significantly improves the charge/discharge capacity and efficiency of a battery.

The present disclosure has been described in detail with reference to specific examples and drawings. However, it should be understood that the scope of the present disclosure is not limited thereto. In addition, various changes and modifications within the scope of the disclosure will become apparent to those skilled in the art from this detailed description.

DESCRIPTION OF DRAWING NUMERALS

101: Elliptical rolling
102: Perfect circle
103: Axis of roller
200: Polycarbonate substrate
300: silicon wafer

What is claimed is:

1. A method for patterning a lithium metal surface, comprising the steps of:
   (S1) forming an intaglio or relief pattern having a predetermined size on a patterning substrate formed of a silicon wafer;
   (S2) after step (S1), forming a photoresist coating layer having a thickness of from 0.7 μm to 1.5 μm on the patterned surface of the patterning substrate, such that the patterned surface of the patterning substrate is totally covered with the photoresist;
   (S3) (a) compressing lithium metal physically to the photoresist covered surface of the patterning substrate to replicate the predetermined pattern on the surface of the lithium metal, or
   (b) applying liquid lithium to the photoresist covered surface of the patterning substrate and solidifying the liquid lithium to replicate the predetermined pattern on the surface of the lithium metal; and
   (S4) separating the lithium metal having the predetermined pattern formed thereon from the patterning substrate,
   and
   wherein a horizontal section of the intaglio or relief pattern having the predetermined size has a size of 10 μm to 900 μm.

2. The method for patterning the lithium metal surface according to claim 1, wherein a horizontal section of the intaglio or relief pattern having the predetermined size has a polygonal, circular or elliptical shape.

3. The method for patterning the lithium metal surface according to claim 1, wherein the intaglio or relief pattern having the predetermined size has a depth or height corresponding to 0.01 to 1 times of the size of a horizontal section of the intaglio or relief pattern having the predetermined size.

* * * * *